United States Patent [19]

Brooks

[11] Patent Number: 4,837,573
[45] Date of Patent: Jun. 6, 1989

[54] DIGITAL TO ANALOG CONVERTER

[75] Inventor: Douglas W. Brooks, Honeoye Falls, N.Y.

[73] Assignee: Process Automation Business, Inc., Columbus, Ohio

[21] Appl. No.: 164,657

[22] Filed: Mar. 3, 1988

[51] Int. Cl.$^4$ .............................................. H03M 1/82
[52] U.S. Cl. .................................... 341/152; 341/144; 377/42
[58] Field of Search ............... 341/126, 132, 133, 136, 341/142, 144, 147, 152; 377/42, 45, 52, 33; 235/310

[56] References Cited

U.S. PATENT DOCUMENTS 3,942,171  3/1976  Haraszti et al. ...................... 341/142
4,389,637  6/1983  Rzeszewski ......................... 341/152

Primary Examiner—William M. Shoop, Jr.
Assistant Examiner—Brian Young
Attorney, Agent, or Firm—Richard H. Berneike

[57] ABSTRACT

A circuit and method for converting a binary number having a plurality of bits, $D_o$ to $D_n$, to a signal having a proportionally equivalent characteristic. The circuit comprises a parallel input for receiving each bit, $D_o$ to $D_n$, of the binary number and means for generating a plurality of wavetrains, $W_o$ to $W_n$, having frequencies decreasing by powers of two from the least significant wavetrain, $W_o$, to the most significant wavetrain, $W_n$. Each wavetrain comprises pulses having a pulse width equal to the inverse of twice the frequence of the least significant wavetrain, $W_o$, so that the duty cycle of each of the wavetrains is proportional to the corresponding frequency thereof. The pulses of each of the wavetrains are not overlapping with the pulses of the other wavetrains. The circuit also comprises logic means, connected to the input and the generating means, for logically multiplying each wavetrain taken in an order from the least significant to the most significant, $W_o$ to $W_n$, by a corresponding bit of the binary number taken in reverse order from the most significant to the least significant, $D_n$ to $D_o$, and logically summing all of the products of each, the sum thereof being a composite waveform. Thus, the composite waveform has a duty cycle proportionally equivalent to the binary number.

21 Claims, 4 Drawing Sheets

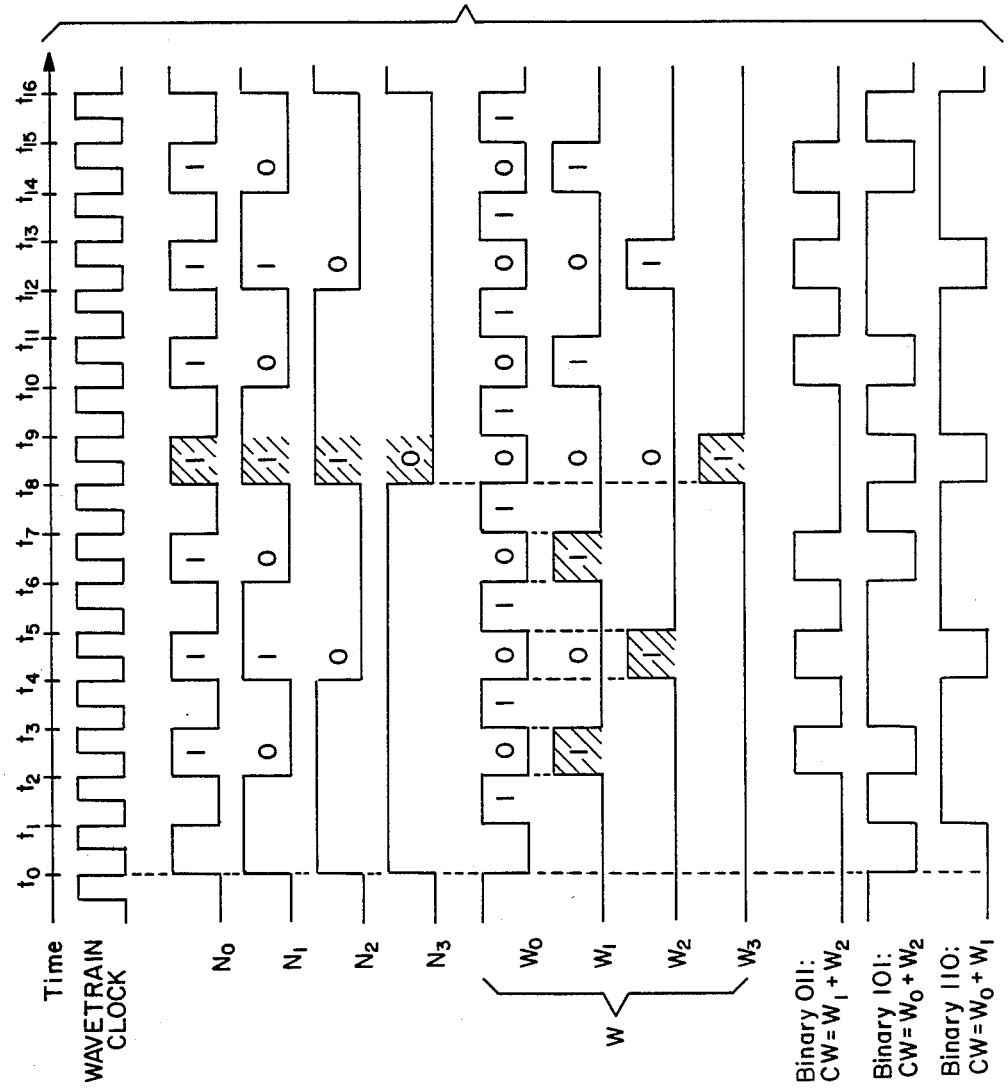

DIGITAL TO ANALOG CONVERTER

BACKGROUND OF THE INVENTION

The present invention relates to a digital to analog converter and, more particularly, to a converter and a method of conversion that accomplishes the conversion by duty cycle modulation.

In the design of interfaces for digital or microprocessor-based electronic circuits, it is often necessary to convert a binary number to an equivalent voltage or current. This is accomplished by a circuit commonly referred to as a digital to analog ("D/A") converter which divides a precision reference voltage into a ratio proportional to the binary number. The division is accomplished either by a ladder of precisely ratioed resistors or by duty cycle modulation. The present invention relates to a D/A converter using duty cycle modulation.

A circuit for this type of D/A conversion generates a wavetrain having a duty cycle proportional to the binary input and an amplitude equal to the reference voltage ($V_r$). The duty cycle, D, is the ratio of time "on" to time "off" for one cycle of a wavetrain. A common approach to generating the wavetrain is to load the binary input into a counter. The output of the counter is held high while the counter counts down to zero. When the counter reaches zero, the output is set back to low until it is time for the cycle to be repeated. The cycle time or wavetrain period, T, is equal to the product of the number, $2^n$, and the period of a clock cycle, where n is the number of bits comprising the binary number. For example, a wavetrain for a three-bit D/A converter could be in one of eight forms, $2^3$, wherein the pulse width [("PW"), where $PW \times (T)(D)$] ranges from $\frac{1}{8}$ to $\frac{7}{8}$ of the wavetrain period, T, and has an amplitude equal to the reference voltage ($V_r$). Thus, for the binary number 011. The D/A converter provides a wavetrain having a duty cycle corresponding to the binary number, i.e., a duty cycle of $D = \frac{3}{8}$. The wavetrain is applied to the input of a low pass filter which derives an average value. The average value of the wavetrain is equal to the product of its amplitude, the reference voltage ($V_r$), and its duty cycle (D), in this case $\frac{3}{8}$.

The low-pass filter can be, for example, a single-pole RC circuit. The problem with such a filter is that the time constant of the filter must be long relative to the wavetrain period (T) in order to reduce the output ripple to a value smaller than one least significant bit, lsb, i.e., a number equal to $\frac{1}{2^n}$, where n is the number of bits comprising the binary number. This requirement seriously limits the speed of response of the D/A converter. Furthermore, a D/A converter for larger binary numbers requires filter components having correspondingly larger values. As a result, the necessary filter components are too large in size for integrated circuit designs. For example, when the time constant of the filter is longer than the wavetrain period (T), the wave shape of the output will be triangular, rising during the high pulse time and falling during the low pulse time. The rising portion of the ripple, R, is defined as follows:

Equation 1: $R = (V_r - V_0)(PW/\tau)$ where:

$V_r$ = reference voltage $V_0$ = output voltage

PW = pulse width of the waveform $\tau$ = time constant of the filter

Since $V_0 = (V_r)(D)$ and $PW = (T)(D)$, the ripple percentage, R% ($= R/V_r$), becomes:

Equation 2: $R\% = (1-D)(D)(T)/\tau$

Since the function $(1-D)(D)$ has a maximum value of 0.25 when D is equal to 0.5 (i.e., a 50% duty cycle), the maximum ripple percentage, R% max, is equal to $0.25(T)/\tau$. As mentioned above, R% max must be less than one lsb or $\frac{1}{2^n}$. Substituting this value for R% max, the time constant of the filter can be defined as follows:

Equation 3: $\tau = 0.25(T)2^n$

Assuming that the frequency, f, is equal to 2 MHz, the filter's time constant for a 3-bit digital number would be equal to 3 ms, which is an acceptable design value. However, the filter's time constant for a 14-bit word would be greater than 33 seconds, which is not acceptable.

Accordingly, there is a need for a D/A converter using duty cycle modulation and, more specifically, one that is capable of converting a large binary number to an analog signal while still using reasonably sized filter components that can be used in conjunction with the design of integrated circuits.

SUMMARY OF THE INVENTION

The present invention meets these needs by providing a circuit and method for converting a binary number having a plurality of bits, $D_0$ to $D_n$, to a signal having aproportionally equivalent characteristic.

The circuit comprises a parallel input for receiving each bit, $D_0$ to $D_n$, of the binary number and means for generating wavetrains, $W_0$ to $W_n$, having frequencies decreasing by powers of two from the least significant wavetrain, $W_0$, to the most significant wavetrain, $W_n$. Each wavetrain comprises pulses having a pulse width equal to the inverse of twice the frequency of the least significant wavetrain, $W_0$, so that the duty cycle of each of the wavetrains is proportional to the corresponding frequency thereof. The pulses of each of the wavetrains are nonoverlapping with the pulses of the other wavetrains. The circuit also codmprises logic means, connected to the input and the generating means, for logically multiplying each wavetrain taken in an order from the least significant to the most significant, $W_0$ to $W_n$, by a corresponding bit of the binary number taken in a reverse order from the most significant to the least significant, $D_n$ to $D_0$, and logically summing all of the products of each, the sum thereof being a composite waveform. The circuit also comprises output means, connected to the logic means, for receiving the composite waveform. Thus, the composite waveform has a duty cycle proportionally equivalent to the binary number.

The output means may further comprises means for smoothing the composite waveform to provide an analog signal equivalent to the duty cycle of the composite waveform, whereby the analog signal is proportionally equivalent to the binary number. The output means may further comprise referencing means for referencing the composite waveform by setting a logic one level of the composite waveform to a precise reference voltage and a logic zero level of the composite waveform to a ground level, whereby the referencing means provides the composite waveform to the smoothing means.

The method comprises the steps of receiving each bit, $D_0$ to $D_n$, of the binary number and providing downcounting signals, $N_0$ to $N_n$, each comprising a series of pulses where in the frequencies decrease by powers of two from the least significant downcounting signal, $N_0$, to the most significant downcounting signal, $N_n$. The method further comprises the step of inverting each downcounting signal, $N_0$ to $N_n$, and logically multiplying each inverted downcounting signal by all of the corresponding less significant downcounting signals, the products thereof forming wavetrains, $W_0$ to $W_n$, each wavetrain having pulses of the same width and not overlapping with the pulses of the other wavetrains and having frequencies decreasing by powers of two from the least significant wavetrain, $W_0$, to the most significant wavetrain, $W_n$. The method further comprises the step of logically multiplying each wavetrain taken in an order from the least significant to the most signicant, $W_0$ to $W_n$, by a corresponding bit of the binary number taken in a reverse order from the most significant to the least significant, $D_n$ to $D_0$, and logically summing all the products of each, the sum thereof being a composite waveform. The composite waveform consists of each wavetrain enabled by the corresponding bit thereof and having a peak amplitude equal to that of the pulses of the wavetrains and a duty cycle proportionally equivalent to the binary number.

The method may further comprise the step of smoothing the composite waveform to provide an analog signal being proportionally equivalent to the binary number and equal to the product of the amplitude and the duty cycle of the composite waveform.

Accordingly, it is an object of the present invention to provide a circuit and method for converting a binary number having any number of bits to a signal having a proportionally equivalent characteristic; to provide a D/A converter and method for D/A conversion using such circuit; to provide an analog signal having a proportionally equivalent voltage or current; and to provide such a D/A converter and a method for D/A conversion that is capable of converting a large binary number to an analog signal while still using reasonably sized filter components that can be used in conjunction with the design of integrated circuits.

Other objects and advantages of the invention will be apparent from the following description, the accompanying drawings, and the appended claims.

BRIEF DESCRIPTION OF THE DRAWINGS

FIG. 4 is a series of time graphs illustrating the relative timing sequence of signals existing within the wavetrain generator and the SP circuit of FIG. 1 to generate a composite waveform signal (CW) in accordance with the invention.

DETAILED DESCRIPTION OF THE INVENTION

Figure 1:
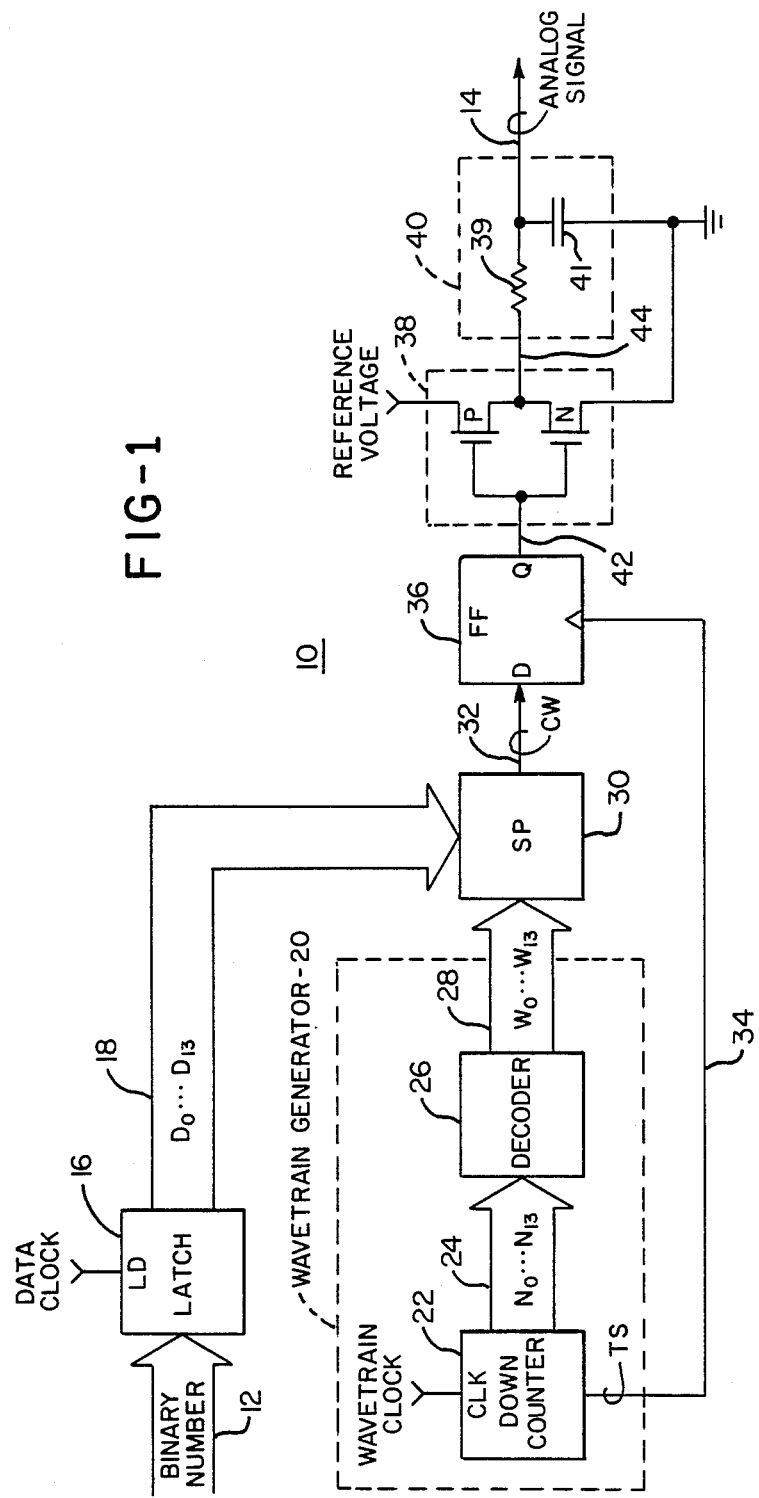
FIG. 1 is an electrical schematic of the D/A converter which comprises a wavetrain generator and a sum of the products (SP) circuit constructed in accordance with the invention.

Referring to FIG. 1, a D/A converter is indicated generally at 10 for converting a binary number at its input along a parallel bus 12 to an analog signal at its output along a wire 14 having an output voltage, $V_0$, proportionally equivalent to the binary number. The D/A converter 10 further comprises a latch 16 having parallel inputs connected to the parallel bus 12 for receiving the binary number and a load terminal LD connected to a data clock. When the data clock causes the load terminal LD to go high, the latch 16 transmits the binary number to its parallel outputs connected to the parallel data bus 18. Each binary data signal or bit, D to $D_{13}$ of the binary number is held at the output of the latch 16 when the load terminal LD goes low.

The D/A converter 10 further comprises a wavetrain generator 20 which consists of a down counter 22, providing 14 downcounting signals, $N_0$ to $N_{13}$, along a parallel bus 24 and a decoder 26 providing 14 wavetrains, $W_0$ to $W_{13}$, along a parallel bus 28. The D/A converter 10 further comprises a sum of products, SP, circuit 30 which is connected to the parallel buses 18, 28 for receiving the binary data signals, $D_0$ to $D_{13}$, and the wavetrains, $W_0$ to $W_{13}$, and for providing a composite waveform, CW, at its output along a wire 32. The down counter 22 provides a timing signal, TS, at its output along a wire 34. The D/A converter 10 further comprises a D-type flip flop 36, a precision reference voltage source 38 and a low-pass filter 40. The D-terminal of the flip flop 36 is connected to the wire 32 for receiving the composite waveform (CW) and the toggle terminal of the flip flop 36 is connected to the wire 34 for receiving the timing signal (TS). The Q-output of the flip flop 36 is connected by a wire 42 to the precision reference voltage source 38 having an output connected via a wire 44 to the low-pass filter 40. The output of the low pass flter 40 provides the analog signal along the wire 14.

Figure 2:
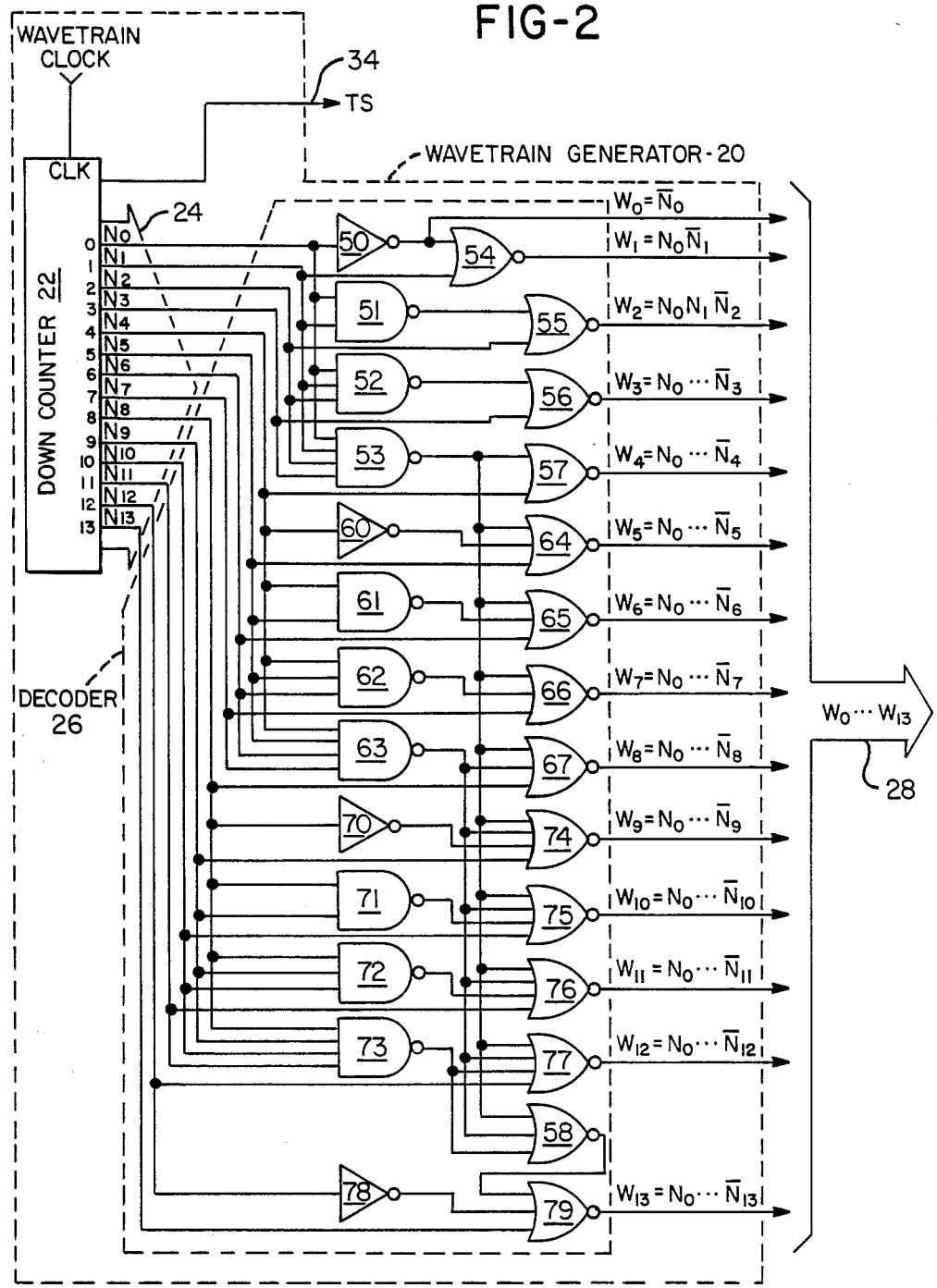
FIG. 2 is an electrical schematic of the wavetrain generator shown as a block diagram in FIG. 1.

Referring to FIG. 2, the wavetrain generator 20 comprises the downcounter 22 and the decoder 26 as described above. The downcounter 22 has fourteen output terminals, 0 to 13, which provide the downcounting signals, $N_0$ to $N_{13}$, to the decoder 26 and are connected to the decoder 26 as follows. Output terminal O is connected to the input of an inverter 50 and the first inputs of three NAND gates 51, 52, 53, the outputs of which are connected respectively to the first inputs of four NOR gates 54, 55, 56, 57. The output of the inverter 50 provides the wavetrain $W_0$ and the outputs of the NOR gates 54, 55, 56, 57 respectively provide the four wavetrains $W_1$ to $W_4$. Output terminal 1 of the downcounter 22 is connected to the second inputs of the NOR gate 54 and the NAND gates 51, 52, 53; output terminal 2 is connected to the second inputs of the NOR gate 55 and third inputs of the NAND gates 52, 53; and, output terminal 3 is connected to the second input of the NOR gate 56 and a fourth input of the NAND gate 53. The output of the NAND gate 53 is also connected to the first input of an OR gate 58.

Output terminal 4 of the downcounter 22 is connected to the input of an inverter 60 and the first inputs of three NAND gates 61, 62, 63, the outputs of which are connected respectively to the first inputs of four NOR gates 64, 65, 66, 67. Output terminal 4 is also connected to the second input of the NOR gate 57. The outputs of the NOR gates 64, 65, 66, 67 respectively provide the four wavetrains, $W_5$ to $W_8$. Output terminal 5 of the downcounter 22 is connected to the second input of the NOR gate 64 and the NAND gates 61, 62, 63; output terminal 6 is connected to the second input of the NOR gate 65 and third inputs of the NAND gates 62, 63; and, output terminal 7 is connected to the second input of the NOR gate 66 and a fourth input of the NAND gate 63.

Output terminal 8 of the downcounter 22 is connected to the input of an inverter 70 and the first inputs of three NAND gates 71, 72, 73, the outputs of which are connected respectively to the first inputs of four NOR gates 74, 75, 76, 77. Output terminal 8 is also connected to the second input of the NOR gate 67. The outputs of the NOR gates 74, 75, 76, 77 respectively provide the four wavetrains, $W_9$ to $W_{12}$. Output terminal 9 of the downcounter 22 is connected to the second input of the NOR gate 74 and the NAND gates 71, 72, 73; output terminal 10 is connected to the second input of the NOR gate 75 and third inputs of the NAND gates 72, 73; and, output terminal 11 is connected to the second input of the NOR gate 76 and a fourth input of the NAND gate 73.

Output terminal 12 is connected to the second input of the NOR gate 77 and the input of an inverter 78, the output of which is connected to the first input of a NOR gate 79. Finally, output terminal 13 of the downcounter 22 is connected to the second input of the NOR gate 79, the output of which provides the wavetrain $W_{13}$. The output of the NAND gate 53 is also connected to third inputs of the NOR gates 64, 65, 66, 67, 74, 75, 76, 77. The output of the NAND gate 63 is also connected to fourth inputs of the NOR gates 74, 75, 76, 77 and the second input of the OR gate 58 having a third input connected to the output of the NAND gate 73. The output of the OR gate 58 is connected to a third input of the NOR gate 79.

Essentially, the decoder 26 derives each wavetrain, $W_0$ to $W_n$, by logically multiplying each of the corresponding negagated downcounting signals, $N_0$ to $N_{13}$, from the counter 22 and all of the lower order output signals from the counter 22. Thus, each wavetrain is defined by the following logic formulas:

$$W_0 = \overline{N_0}$$

$$W_1 = N_0\overline{N_1}$$

$$W_2 = N_0N_1\overline{N_2}$$

$$W_3 = N_0N_1N_2\overline{N_3}$$

$$\cdot$$

$$W_n = N_0 N_1 N_2 N_3 \ldots \overline{N_n}$$

Referring also to FIG. 4, the wavetrain clock signal, the first four least significant downcounting signals, $N_0$ to $N_3$, and the first four least significant wavetrains, $W_0$ to $W_3$, are shown in the time domain over a period from $t_0$ to $t_{16}$ as an example. All of the following discussion applies equally to all the higher order wavetrains from $W_4$ to $W_{13}$ to $W_n$. The corresponding truth table for this logic circuit is as follows (certain logic zero being indicated by a blank space for illustration):

TABLE A

| Time | $N_3$ | $N_2$ | $N_1$ | $N_0$ | $W_3$ | $W_2$ | $W_1$ | $W_0$ |
|---|---|---|---|---|---|---|---|---|
| $t_{15}$ | 0 | 0 | 0 | 0 | | | | 1 |
| $t_{14}$ | 0 | 0 | 0 | 1 | | | 1 | 0 |
| $t_{13}$ | 0 | 0 | 1 | 0 | | | | 1 |
| $t_{12}$ | 0 | 0 | 1 | 1 | | 1 | 0 | 0 |
| $t_{11}$ | 0 | 1 | 0 | 0 | | | | 1 |
| $t_{10}$ | 0 | 1 | 0 | 1 | | | 1 | 0 |
| $t_9$ | 0 | 1 | 1 | 0 | | | | 1 |
| $t_8$ | 0 | 1 | 1 | 1 | 1-- | 0-- | 0-- | 0 |
| $t_7$ | 1 | 0 | 0 | 0 | | | | 1 |
| $t_6$ | 1 | 0 | 0 | 1 | | | 1-- | 0 |
| $t_5$ | 1 | 0 | 1 | 0 | | | | 1 |
| $t_4$ | 1 | 0 | 1 | 1 | | 1-- | 0-- | 0 |
| $t_3$ | 1 | 1 | 0 | 0 | | | | 1 |
| $t_2$ | 1 | 1 | 0 | 1 | | | 1-- | 0 |
| $t_1$ | 1 | 1 | 1 | 0 | | | | 1 |
| $t_0$ | 1 | 1 | 1 | 1 | | | | 0 |

As can be seen in FIG. 4, the frequencies of the wavetrains, $W_0$ to $W_3$, decrease by powers of 2 from the least significant wavetrain, $W_0$, to the most significant wavetrain, $W_3$. Assuming that the frequency of the wavetrain clock is equal to 2 MHz, the frequencies of the wavetrains, $W_0$ to $W_3$, would be respectively 1.0, 0.5, 0.25 and 0.125 MHz; the frequency for the most significant wavetrain $W_{13}$ would be equal to about 122 Hz. Additionally, the pulse-width (PW) of each wavetrain is equal to the inverse of twice the frequency of the least significant wavetrain, $W_0$. This results because each wavetrain is derived by ANDing the corresponding negated output signal from the counter 22 and with all of the lower order output signals. This is illustrated by the shading in FIG. 4 for the wavetrain $W_3$ at time $t_8$ and by the corresponding dashed lines at time $t_8$ in the truth table, Table A.

Assuming again that the wavetrain clock frequency is equal to 2 MHz, the pulse width (PW) for the pulses of all the wavetrains, $W_0$ to $W_n$, is equal to 500 nanoseconds. Since the wavetrains comprise pulses having the same width, the duty cycle (D) of each wavetrain is proportional to its frequency. Therefore, the duty cycle (D) of the wavetrains, $W_0$ to $W_3$, would be respectively $\frac{1}{2}$, $\frac{1}{4}$, $\frac{1}{8}$ and 1/16; the duty cycle (D) for the most significant wavetrain ($W_{13}$) would be equal to 1/16384, i.e. $\frac{1}{2}^n$, where n=14.

The wavetrains are also nonoverlapping, i.e., the pulses of one wavetrain do not overlap the pulses of any other wavetrain in time as shown by the shading in FIG. 4 for the wavetrains, $W_1$ and $W_2$, at times $t_2$, $t_4$ and $t_6$ and by the corresponding dahsed lines at the same times in the truth table, Table A. The wavetrains are nonoverlapping because a downcounter causes only one bit to go to 0 at a time as shown in the truth table, Table A. The nonoverlapping feature is important because any combination of the wavetrains can be logically ORed to produce an equivalent composite duty cycle for the binary number being converted.

Figure 3:
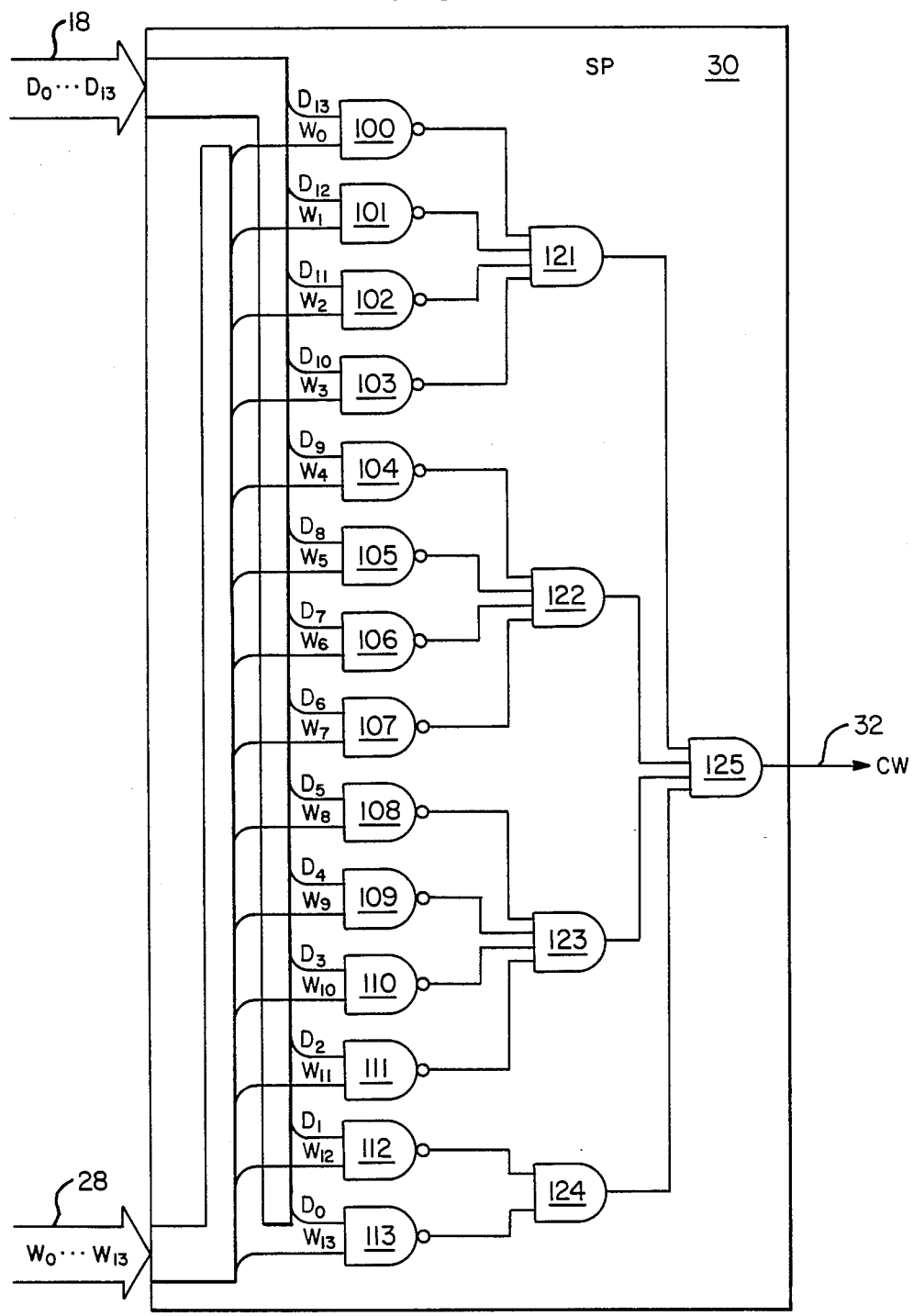
FIG. 3 is an electrical schematic of the SP circuit shown as a block in FIG. 1.

Referring to FIG. 3, the wavetrains, $W_0$ to $W_{13}$, are provided to the SP circuit 30 by the parallel bus 28 which provides each wavetrain via a separate wire to the first inputs, respectively, of fourteen NAND gates 100 to 113. The binary bits, $D_{13}$ to $D_0$, of the binary number are also provided to SP circuit by the parallel bus 18 which provides each bit via a separate wire to the second inputs, respectively, of the NAND gates 100 to 113. The outputs of the NAND gates 100 to 103 are connected to the inputs of an AND gate 121; the outputs of the NAND gates 104 to 107 are connected to the inputs of an AND gate 122, the outputs of the NAND gates 108 to 111 are connected to the inputs of an AND gate 123; and, the outputs of the NAND gates 112 and 113 are connected to the inputs of an AND gate 124. The outputs of the AND gates 121 to 124 are connected to the inputs of an AND gate 125, the output of which provides the composite waveform signal (CW) on the wire 32 which has a duty cycle (D) proportional to the binary number.

Essentially, the SP circuit 30 is a sum-of-products circuit. When viewing the operation of the gates 100 to 113 as AND gates, they form the logical products, $W_0 D_{13}$ to $W_{13}D_0$. Associating the inversion of the NAND gates, 100 to 113, with the inputs of the AND gates, 121 to 124, transforms them into NOR gates which function as OR gates when their inverted outputs are applied to the AND gate 125. Thus, the products, $W_0D_{13}$ to $W_{13}D_0$, are logically ORed or summed by gates 121 to 125 to form the logical expression for the composite waveform (CW) as follows:

$$CW = W_0D_{13} + W_1D_{12} + \ldots + W_{13}D_0$$

Each wavetrain, $W_0$ to $W_{13}$, is ANDed with the corresponding binary bit, $D_{13}$ to $D_0$, and the resulting products are ORed together.

The wavetrains to be included in the composite waveform (CW) are selected by the corresponding binary bits, i.e., a positive pulse enables the transmission of the corresponding wavetrain. The enabled wavetrains are logically summed to form the composite waveform (CW) which has a duty cycle (D) proportional to the binary word. For example, if the D/A converter 10 is designed to convert a three-bit binary number, the composite waveform (CW) is defined as follows:

$$CW = W_0D_2 + W_1D_1 + W_2D_0$$

Referring to this logical equation and the wavetrains $W_0$, $W_1$ and $W_2$ in FIG. 4, the duty cycle (D) corresponding to each binary number can be determined as shown in the following truth table:

TABLE B

| W = $W_0$<br>D = $D_2$ | $W_1$<br>$D_1$ | $W_2$<br>$D_0$ | CW | D |
|---|---|---|---|---|
| 0 | 0 | 1 | $W_2$ | 1/8 |
| 0 | 1 | 0 | $W_1$ | 2/8 |
| 0 | 1 | 1 | $W_1 + W_2$ | 3/8 |
| 1 | 0 | 0 | $W_0$ | 4/8 |
| 1 | 0 | 1 | $W_0 + W_2$ | 5/8 |
| 1 | 1 | 0 | $W_0 + W_1$ | 6/8 |
| 1 | 1 | 1 | $W_0 + W_1 + W_2$ | 7/8 |

As can be seen in both Table B and FIG. 4, the duty cycle (D) increases in direct proportion to the binary number being converted because the wavetrain having the highest frequency $W_0$, is selected if the most significant bit, $D_2$, is set, the wavetrain having the second highest frequency, $W_1$, is selected if the second most significant bit, $D_1$, is set, and the wavetrain having the third highest frequency, $W_2$, is selected if the third most significant bit, $D_0$, is set. The same explanation applies to a D/A converter for converting a 14-bit word where the duty cycle (D) of the composite waveform (CW) will vary by increments of 1/16,384 ($\frac{1}{2}^n$).

The composite wave form (CW) is then clocked by the timing signal (TS), in this case 2 MHz, through the flip flop 36 to synchronize precisely the edges to the wavetrain clock, thus eliminating the effects of varying propagation delays. The output from the flip flop 36 is provided via the wire 42 to the precision reference voltage source 38 which comprises a discrete CMOS transistor package including an NMOS FET and a PMOS FET. A positive reference voltage, $V_r$, is applied to the drain terminal of the PMOS FET and the source of the NMOS FET is grounded. The wire 42 is connected to the gate terminals of both FETS. The source terminal of the PMOS FET and the drain terminal of the NMOS FET are connected and provide an output signal via the wire 44 to the low-pass filter 40. The CMOS transistor package insures that the logic one and zero levels are accurately set to the reference voltage ($V_r$) and to the analog ground level. The low-pass filter 40 is a single-pole RC filter comprising a resistor 39 having one end connected to the wire 44 and a capacitor 41 connected between the other end of the resistor 39 and ground. the low-pass filter 40 integrates the composite waveform output signal provided via the wire 44 to obtain the average DC value which is the analog output signal provided via the wire 14 across the capacitor 41. The analog signal is equal to the product of the reference voltage ($V_r$) and the duty cycle (D) of the composite waveform (CS), and is therefore proportional to the binary number being converted.

The D/A converter 10 just described drastically reduces the requirement of earlier devices for filters having time constants that were too large for practical design in order to insure that the ripple percentage (R%) is less than one least significant bit. The ripple at the output of the filter 40 is determined by adding the individual ripple due to each wavetrain comprising the composite waveform (CW). Therefore, Equation 2 must be solved for each composite wavetrain.

As previously defined, the time period (T) is equal to $2^n$ wavetrain clock cycles. For the D/A converter 10, it is also the time period of the wavetrain, $W_{13}$, having the lowest frequency that is associated with the least significant bit, $D_0$, of the binary number. Therefore, the period, $T_n$, of all the other wavetrains, $W_0$ to $W_{12}$, is equal to $T/2$ where b is the bit number ranging from 0 to the number, n-1 or 12, for the most significant bit. The duty cycle, $D_n$, also varies for each component wavetrain and is equal to $2^b/2^n$. When $T_n$ and $D_n$ are substituted into Equation 2, the ripple percentage is defined as follows:

Equation 4: $R\% = (1 - 2^b/2^n)(\frac{1}{2}^n)(T/\tau)$

For the most significant bit, $D_{13}$, the duty cycle of the corresponding wavetrain, $W_0$, is 0.5, which makes the ripple percentage (R%) half that of the lower significant bits, $D_0$ to $D_{12}$ ($2^b/2^n$ approaches 0.5). The maximum ripple percentage (R% max) is for the least significant bit, $D_0$, where the duty cycle is nearly 1.0 ($2^b/2^n$ approaches 0). Therefore, if all the composite wavetrain components, $W_0$ to $W_{13}$, are selected and were in phase, the maximum ripple percentage (R% max) is equal to n times the ripple percentage of the least significant bit or $n(\frac{1}{2}^n)(T/\tau)$. Hence, if the ripple percentage is to be less than one least significant bit, $\frac{1}{2}^n$, and substituting into the immediately preceding equation, then the time constant for the RC filter 40 is defined as:

Equation 5: $\tau = 2T = 2(2^n/f) = 2^{n+1}/f$

Thus, for a 14-bit D/A converter having a wavetrain clock operating at 2 MHz, the time constant must be no smaller than 16 ms which is substantially smaller than the 33 seconds required by previous D/A converters. In the specific embodiment of the present invention, the resistor 39 has a value of 200 K ohms and the capacitor 41 has a value of 0.01 microfarads which provides a time constant of 20 ms that satisfies the above requirement. Filter components having these values are much less expensive and very much smaller than what would be required for previous D/A converters.

Having described the invention in detail and by reference to preferred embodiments thereof, it will be apparent that other modifications and variations are possible without departing from the scope of the invention defined in the appended claims.

What is claimed is:

1. A circuit for converting a binary number having bits, $D_0$ to $D_n$, to an output signal having a proportionally equivalent characteristic, said circuit comprising:
   a parallel input for receiving each bit, $D_0$ to $D_n$, of the binary number;
   means for generating wavetrains, $W_0$ to $W_n$, having frequencies decreasing by powers of two from the least significant wavetrain, $W_0$, to the most significant wavetrain, $W_n$, each of said wavetrains comprising pulses having a pulse width equal to the inverse of twice the frequency of the least significant wavetrain, $W_0$, so that the duty cycle of each of said wavetrains is proportional to the corresponding frequency thereof, and the pulses of each of said wavetrains are nonoverlapping with the pulses of others of said wavetrains;
   logic means, connected to said input and said generating means, for logically multiplying each of said wavetrains taken in an order from the least significant to the most significant, $W_0$ to $W_n$, by a corresponding bit of the binary number taken in a reverse order from the most significant to the least significant, $D_n$ to $D_0$, and logically summing all the products of each, the sum thereof being a composite waveform; and,
   output means, connected to said logic means, for receiving said composite waveform and for providing said output signal, in response thereto;
   whereby, said composite waveform has an amplitude equal to that of the pulses of said wavetrains and a duty cycle proportionally equivalent to the binary number.

2. A circuit as recited in claim 1, wherein said means for generating comprises:
   a donwcounter having outputs providing n signals, $N_0$ to $N_n$, wherein the frequencies decrease by powers of two from the least significant downcounting signal, $N_0$, to the most significant downcounting signal, $N_n$; and,
   decoder means, connected to the outputs of said downcounter, for inverting each downcounting signal, $N_0$ to $N_n$, therefrom and logically multiplying each inverted downcounting signal by all of the corresponding less significant downcounting signals from said downcounter, the products therefrom forming said wavetrains, $W_0$ to $W_n$.

3. A circuit as recited in claim 2, wherein said downcounter provides a timing signal, and wherein said output means further comprises synchronizing means for receiving said timing signal and synchronizing the edges of said composite waveform with the least significant downcounting signal ($N_0$) to elimiate the effects of propagation delays.

4. A circuit as recited in claim 3, wherein said synchronizing means comprises a D-type flip flop having a data terminal connected to said logic means and a toggle input connected to said downcounter for receiving the timing signal, the output of said flip flop providing said synchronized composite waveform.

5. A circuit as recited in claim 1, wherein said output means further comprises means for smoothing said composite waveform to provide an analog signal equal to the product of the amplitude and the duty cycle of said composite waveform, whereby said analog signal is proportionally equivalent to the binary number.

6. A circuit as recited in claim 5, wherein said means for smoothing is a low-pass filter.

7. A circuit as recited in claim 6 wherein said low-pass filter comprises a resistor and a capacitor, said resistor having one end connected to said logic means and the other end connected to the output of said circuit and said capacitor connected between ground and the output of said circuit, said analog signal being provided as said output signal.

8. A circuit as recited in claim 5, wherein said output means further comprising referencing means for referencing said composite waveform by setting a logic one level of said composite waveform to a precise reference voltage and a logic zero level of said composite waveform to a ground level, whereby said referencing means provides said composite waveform to said means for smoothing.

9. A circuit as recited in claim 8, wherein said referencing means comprises a PMOS FET and an NMOS FET, the gates of which are connected to receive said composite waveform, the drain terminal of said PMOS FET being connected to a positive precise reference voltage source, the source terminal of said NMOS FET being connected to ground, and the source terminal of said PMOS FET and the drain terminal of said NMOS FET both being connected to said means for smoothing.

10. A digital to analog converter for converting a binary number having bits, $D_0$ to $D_n$, to an analog signal having a proportionally equivalent voltage, said converter comprising:
   a parallel input for receiving each bit, $D_0$ to $D_n$, of the binary number:
   a downcounter having outputs providing downcounting signals, $N_0$ to $N_n$, wherein the frequencies of said signals decrease by powers of two from the least significant downcounting signal, $N_0$, to the most significant downcounting signal, $N_n$;
   decoder means, connected to the outputs of said downcounter, for inverting each downcounting signal, $N_0$ to $N_n$, and logically multiplying each inverted downcounting signal by all of the corresponding less significant downcounting signals from said downcounter, the products therefrom forming wavetrains, $W_0$ to $W_n$, having frequencies decreasing by powers of two from the least significant wavetrain, $W_0$, to the most significant wavetrain, $W_n$;
   logic means, connected to said parallel input and said decoder means, for logically multiplying each of said wavetrains taken in an order from the least significant to the most significant, $W_0$ to $W_n$, by a corresponding bit of the binary number taken in a reverse order from the most significant to the least significant, $D_n$ to $D_0$, and logically summing all the products, the sum thereof being a composite waveform, consisting of each of said wavetrains enabled by said corresponding bits of said binary number and having a peak amplitude equal to that of the pulses of the wavetrains and a duty cycle proportionally equivalent to the binary number; and, means, connected to said logic means, for smoothing said composite waveform to provide said analog signal;

whereby the analog signal is proportionally output equivalent to the binary numer and equal to the product of the amplitude and the duty cycle of said composite waveform.

11. A circuit as recited in claim 10, wherein said downcounter provides a timing signal, and wherein said circuit further comprises synchronizing means, connected to receive said composite waveform and said timing signal, for synchronizing the edges of said composite waveform with the least significant downcounting signal ($N_0$) to eliminate the effects of propagation delays.

12. A circuit as recited in claim 11, wherein said synchronizing means comprises a D-type flip flop having a data terminal connected to said logic means and a toggle input connected to said downcounter for receiving the timing signal, the output of said flip flop providing said synchronized composite waveform.

13. A circuit as recited in claim 10, wherein said means for smoothing is a low-pass filter.

14. A circuit as recited in claim 13 wherein said low-pass filter comprises a resistor and a capacitor, said resistor having one end connected to said logic means and the other end connected to the output of said circuit and said capacitor connected between ground and the output of said circuit, whereby the output of said circuit provides said analog signal.

15. A circuit as recited in claim 10, further comprising referencing means for referencing said composite waveform by setting a logic one level of said composite waveform to a precise reference voltage and a logic zero level of said composite waveform to a ground level, whereby said referencing means provides said composite waveform to said smoothing means.

16. A circuit as recited in claim 15, wherein said referencing means comprises a PMOS FET and an NMOS FET, the gates of which are connected to receive said composite waveform, the drain terminal of said PMOS FET being connected to a positive precise reference voltage source, the source terminal of said NMOS FET being connected to ground, and the source terminal of said PMOS FET and the drain of said NMOS FET both being connected to said means for smoothing.

17. A circuit for generating wavetrains, $W_0$ to $W_n$, comprising:

a downcounter having outputs providing downcounting signals, $N_0$ to $N_n$, wherein the frequencies decrease by powers of two from the least significant downcounting signal, $N_0$, to the most significant downcounting signal, $N_n$;

decoder means, connected to the outputs of said downcounter, for inverting each downcounting signal, $N_0$ to $N_n$, and logically multiplying each inverted downcounting signal by all of the corresponding less significant downcounting signals from said downcounter, the products therefrom forming the wavetrains, $W_0$ to $W_n$, having pulses of equal pulse width; and output means, connected to said decoder means, for providing the wavetrains, $W_0$ to $W_n$;

whereby, the duty cycle of each of said wavetrains is proportional to the corresponding frequency thereof and the pulses of said wavetrain are nonoverlapping with the pulses of other of said wavetrains.

18. A method for converting a binary number having bits, $D_0$ to $D_n$, to an output signal having a proportionally equivalent characteristic, the method comprising the steps of:

receiving each bit, $D_0$ to $D_n$, of the binary number;

providing downcounting signals, $N_0$ to $N_n$, each comprising a series of pulses wherein the frequencies decrease by powers of two from the least significant downcounting signal, $N_0$, to the most significant downcounting signal, $N_n$;

inverting each downcounting signal, $N_0$ to $N_n$, and logically multiplying each inverted downcounting signal by all of the corresponding less significant downcounting signals, the products thereof forming wavetrains, $W_0$ to $W_n$, each wavetrain having pulses of the same width and nonoverlapping with the pulses of the other wavetrains, said wavetrains having frequencies decreasing by powers of two from the least significant wavetrain, $W_0$, to the most significant wavetrain, $W_n$; and logically multiplying each wavetrain taken in an order from the least significant to the most significant, $W_0$ to $W_n$, by a corresponding bit of the binary number taken in a reverse order from the most significant to the least significant, $D_n$ to $D_0$, and logically summing all of the products of each, the sum thereof being a composite waveform, consisting of each wavetrain enabled by the corresponding bit thereof and having a peak amplitude equal to that of the pulses of the wavetrains and a duty cycle proportionally equivalent to the binary number.

19. A method as recited in claim 18 further comprising the step of smoothing in the composite waveform to provide an analog signal being proportionally equivalent to the binary number and equal to the product of the amplitude and the duty cycle of the composite waveform.

20. A method as recited in claim 18 further comprising the step of synchronizing the edges of the composite waveform with the least significant downcounting signal ($N_0$) to eliminate the effects of propagation delays.

21. A method as recited in claim 18 further comprising the step of referencing the composite waveform by setting a logic one level of the composite waveform to a precise reference voltage and a logic zero level of the composite waveform (CW) to a ground level.

* * * * *

UNITED STATES PATENT AND TRADEMARK OFFICE
CERTIFICATE OF CORRECTION

PATENT NO. : 4,837,573
DATED : June 6, 1989
INVENTOR(S) : Brooks

It is certified that error appears in the above-identified patent and that said Letters Patent is hereby corrected as shown below: On the title page:

Abstract line 10, "frequence" should be --frequency--

Col. 1, line 39, "011. The" should be --011, the--
Col. 2, line 36, "aproportionally" should be --a proportionally--
Col. 2, line 48, "codmprises" should be --comprises--
Col. 2, line 61, "comprises" should be --comprise--
Col. 4, line 15, "Dto" should be --$D_o$ to--
Col. 4, line 39, "flter" should be --filter--
Col. 6, line 31, "22 and" should be --22--
Col. 6, line 50, "dahsed" should be --dashed--
Col. 8, line 19, "ground. the" should be --ground. The--
Col. 8, line 25, "(CS)" should be --(CW)--
Col. 8, line 43, "T/2" should be --$T/2^b$--
Col. 10, line 1, "elimiate" should be --eliminate--
Col. 11, line 13, "numer" should be --number--

UNITED STATES PATENT AND TRADEMARK OFFICE
CERTIFICATE OF CORRECTION

PATENT NO. : 4,837,573

DATED : June 6, 1989

INVENTOR(S) : Brooks

It is certified that error appears in the above-identified patent and that said Letters Patent is hereby corrected as shown below:

Column 12, line 14, has been modified to read; "of other of said" should read --of others of said--

Signed and Sealed this

Twenty-fourth Day of April, 1990

Attest:

HARRY F. MANBECK, JR.

*Attesting Officer*  *Commissioner of Patents and Trademarks*